United States Patent
Lakhani et al.

(10) Patent No.: US 6,278,642 B1
(45) Date of Patent: Aug. 21, 2001

(54) METHOD AND APPARATUS FOR LIMITING BITLINE CURRENT

(75) Inventors: Vinod Lakhani, Milpitas; Christophe J. Chevallier, Palo Alto, both of CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/435,588

(22) Filed: Nov. 8, 1999

Related U.S. Application Data

(63) Continuation of application No. 09/031,924, filed on Feb. 27, 1998, now Pat. No. 5,995,423.

(51) Int. Cl.[7] .................................................. G11C 7/00
(52) U.S. Cl. ................ 365/200; 365/185.02; 365/185.28
(58) Field of Search ......................... 365/185.02, 185.18, 365/185.28, 200

(56) References Cited

U.S. PATENT DOCUMENTS

| | | |
|---|---|---|
| 4,636,983 | 1/1987 | Young et al. .......................... 365/181 |
| 4,899,070 | 2/1990 | Ou et al. . |
| 5,187,392 | 2/1993 | Allen . |
| 5,357,463 | 10/1994 | Kinney . |
| 5,398,203 | 3/1995 | Prickett, Jr. et al. ................. 365/185 |
| 5,499,211 | 3/1996 | Kirihata et al. ....................... 365/203 |
| 5,568,435 | 10/1996 | Marr ..................................... 365/201 |
| 5,581,504 | 12/1996 | Chang .............................. 365/185.17 |
| 5,673,224 | 9/1997 | Chevallier et al. ............. 365/185.23 |
| 5,959,892 | * 9/1999 | Liu et al. .......................... 365/185.28 |

* cited by examiner

*Primary Examiner*—Richard Elms
*Assistant Examiner*—VanThu Nguyen
(74) *Attorney, Agent, or Firm*—Schwegman, Lundberg, Woessner & Kluth, P.A.

(57) ABSTRACT

A flash memory integrated circuit includes wordlines, bitlines, an array of floating gate transistor memory cells, and current limiters. Each floating transistor memory cell is coupled to one of the bitlines and one of the wordlines. The current limiters operate when the floating gate transistor memory cells are programmed to limit an amount of current that a defective transistor memory cell draws through the bitline coupled to the defective transistor memory cell.

35 Claims, 4 Drawing Sheets

METHOD AND APPARATUS FOR LIMITING BITLINE CURRENT

This application is a continuation of U.S. Ser. No. 09/031,924, filed on Feb. 27, 1998, now U.S. Pat. No. 5,995,423.

THE FIELD OF THE INVENTION

The present invention relates generally to integrated circuits and more particularly, to limiting current drawn by memory cells during programming operations in nonvolatile memory integrated circuits, such flash electrically programmable and erasable read only memories.

BACKGROUND OF THE INVENTION

It is conventional to implement a memory system in an integrated circuit including an array of nonvolatile memory cells, such as flash memory cells, and circuitry for independently erasing selected blocks of the nonvolatile memory cells. A flash memory array circuit includes rows and columns of nonvolatile flash memory cells. Thus, each of the cells or storage locations of the flash memory array circuit are indexed by a row index and a column index.

Each column of cells of the flash memory array include memory cells with each cell being implemented with a floating-gate n-channel transistor. The drains of all transistors of a column are connected to a bitline, and the gate of each of the transistors is connected to a different wordline. The sources of the transistors are held at a source potential, such as ground, during a read or programming operation. Each memory cell is a nonvolatile memory cell since the transistor of each cell has a floating gate capable of semi-permanent charge storage. The current drawn by each cell depends on the amount of charge stored on the cell's floating gate. Thus, the charge stored on each floating gate determines a data value that is stored semi-permanently in the corresponding cell. In a flash memory device, the charge stored on the floating gate of each cell is erasable by appropriately changing the voltage applied to the gate and source in a manner known in the art.

Typically, the cells of a flash memory array can be erased in blocks, such as boot blocks or sector-array blocks, or the entire integrated circuit chip can be erased at once using a bulk erase. Reads and writes are, however, typically performed on a random byte or word basis in conventional flash memory devices.

An example of a flash memory array is described in U.S. patent application Ser. No. 08/606,246, entitled "SEGMENTED NON-VOLATILE MEMORY ARRAY WITH MULTIPLE SOURCES WITH IMPROVED WORD LINE CONTROL CIRCUITRY," filed on Feb. 23, 1996 and assigned to the assignee of the present application, which is herein incorporated by reference. .

The floating gate transistor is programmed by charge transport of electrons across a gate insulator onto the floating gate for storage. The floating gate transistor is erased removing the stored electrons from the floating gate and transporting these charges back across the gate insulator. The floating gate transistor is read by detecting a current, the conductance of which varies depending on whether or not electrons are stored on the floating gate.

One example of programming an n-channel floating gate field-effect transistor (FET) includes applying approximately +12 Volts between a select/control gate (control gate), which is capacitively coupled to the floating gate, and a source region of the FET. Approximately +6 Volts is applied between a drain region of the FET and the source region. Electrons are accelerated from the source region toward the drain region in a channel region formed between the source and drain regions. The electrons acquire kinetic energy, thereby freeing additional electrons that are accelerated toward the drain region. High energy "hot" electrons are attracted across the energy barrier of the gate insulator by the electric field resulting from the high voltage applied to the control gate. The electrons that accumulate on the floating gate raise a turn-on threshold voltage ($V_T$) magnitude that inhibit current conductance between the drain and source regions when a read voltage is applied to the control gate during a read operation.

One example of erasing the n-channel floating gate FET includes applying approximately −10 Volts to the control gate, +5 Volts to the source region, and isolating (floating) the drain region of the FET. Electrons that were previously stored on the floating gate are removed from the floating gate by Fowler-Nordheim tunneling of the electrons across the underlying gate insulator. The $V_T$ magnitude is decreased toward its unprogrammed value, allowing current conduction between drain and source regions when a read voltage is applied to the control gate during a read operation.

Flash memory systems have been employed to emulate magnetic disk drive systems. Typically, the flash memory system is implemented as a card for insertion into a computer system with a chip set mounted on the card. The chip set includes an onboard controller and several memory chips controlled by the controller. Each memory chip implements an array of flash memory cells organized into independently erasable blocks.

Flash memory employed in mass storage applications, such as in systems that emulate magnetic disk drives, is typically very defect-tolerant. Row, column, block, and single-bit defects can be effectively mapped out of the memory system. These defects are stored in tables which are accessible by the controller. The storage of the defects in the tables substantially eliminates the need for on-chip redundancy which would otherwise occupy a large area of the chip die. Storage of the defects in the tables also permits a higher yield in manufacturing the memory chip set because more die can be produced per wafer due to the enhanced redundancy capabilities of the flash memory system.

The defect-mapped scheme can, however, complicate testing processes because defects need to be identified, mapped out, and stored in the controller-accessible tables. One example of a column defect is a row-column short. It is typically desired to program eight or more columns at a time, but a row-column short defect could draw excessive amounts of current preventing the flash memory cells in other columns from being programmed.

One solution to prevent defective columns from drawing excessive amounts of current during programming of the memory cells is to have the tester not program the defective columns. This solution, however, increases the tester costs and also complicates parallel testing because this solution requires a unique data pattern for each die under test.

There is a great industry-wide push to lower the power supply voltages for flash memory integrated circuits. As a result, typically all of the programming high voltages in a flash memory are internally generated with charge pumps. The charge pumps have a limited ability to supply current. Thus, a defective cell pulls down the internally-generated bitline supply voltage during programming operations.

For reasons stated above and for other reasons presented in greater detail in the Description of the Preferred Embodiments section of the present specification, there is a need for limiting the amount of current the defective cells draw during programing operations of non-volatile memory integrated circuits, such as flash memories.

SUMMARY OF THE INVENTION

The present invention provides a method and a memory integrated circuit having wordlines, bitlines, and an array of transistor memory cells. Each transistor memory cell is coupled to one of the bitlines and one of the wordlines. Current limiters are coupled to the bitlines such that each current limiter is coupled to one of the bitlines.

In one embodiment, each current limiter limits the amount of current that a defective transistor memory cell draws through the bitline coupled to the defective transistor memory cell. In one embodiment, the current limiters each comprise a current mirror circuit.

In one embodiment, the array of transistor memory cells includes floating gate transistor memory cells. In one embodiment, the current limiters are operated when data is programmed into the floating gate transistor memory cells.

In one embodiment, the current limiters are adjustable by trimming. In one embodiment, the current limiters can be disabled. In one embodiment, the current limiters can be disabled by trimming the current limit to a value that is sufficiently high that the current limiter does not limit the amount of current that a defective transistor memory cell draws through the bitline coupled to the defective transistor memory cell.

In one embodiment, the current limiter is in an input data latch and limits the current drawn by defective floating gate transistor memory cells through the bitline coupled to the data latch. By limiting the amount of current drawn through the bitline, other floating gate transistor memory cells can be programmed at the same time as defective floating gate transistor memory cells.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

The following described embodiments of the present invention are described as applied to flash memories similar in many respects to conventional flash memories, such as those commercially available from Micron Quantum Devices, Inc. of California. For clarity, only a portion of the well known circuitry of the flash memory described herein, while the new circuitry of the flash memory of the present invention is described in detail herein.

Memory System

Figure 1:
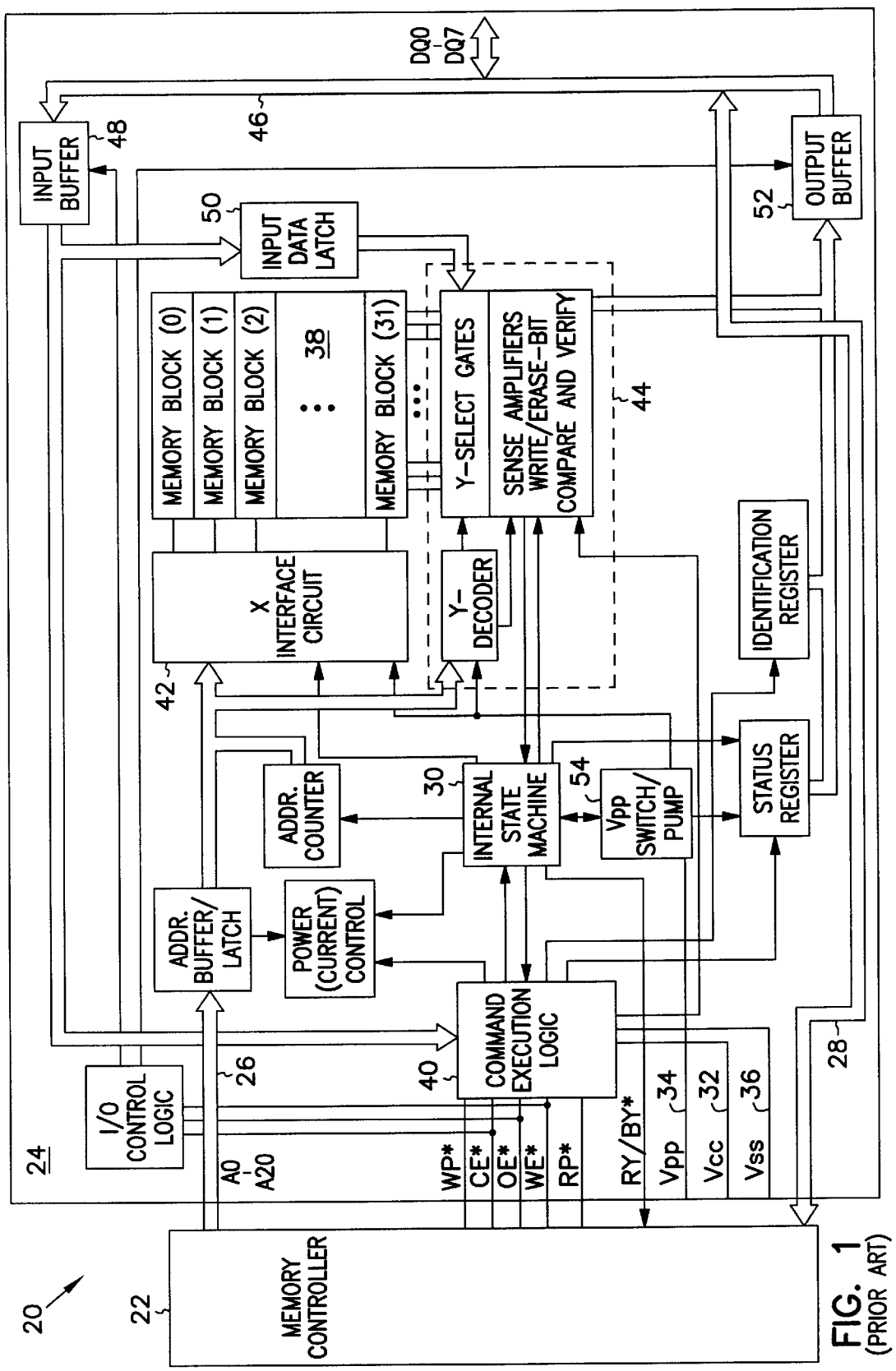
FIG. 1 is a block diagram of a flash memory system.

One embodiment of a nonvolatile flash memory system is illustrated generally at 20 in block diagram form in FIG. 1. Flash memory system 20 includes a memory controller 22 and a flash memory integrated circuit 24. Memory controller 24 includes a microprocessor or any other suitable controller for providing interface signals to flash memory integrated circuit 24. For example, such interface signals include addressing signals, provided at address lines 26, and data signals, communicated at data lines 28. Other interface signals provided by controller 30 include write enable (WE*), chip enable (CE*), reset/power-down (RP*), and output enable (OE*), all of which are active low signals.

Flash memory integrated circuit 24 provides a status signal (RY/BY*) to memory controller 22 to indicate the status of an internal state machine 30. Flash memory integrated circuit 24 also receives a positive power supply voltage (Vcc) at a node 32 (e.g., approximately 3.3 Volts or approximately 5 Volts), a write/erase supply voltage (Vpp) at a node 34 (e.g., approximately 5 Volts), and a reference voltage such as substrate ground voltage (Vss) at a node 36 (e.g., approximately 0 Volts).

In the embodiment of FIG. 1, flash memory integrated circuit 24 includes a memory cell array 38 having floating gate transistor memory cells arranged in 32 memory cell blocks (0:31). In one embodiment, each memory cell block in memory cell array 38 includes 64 kilobytes of floating gate transistor memory cells. Data stored in each memory cell block is erased independently without disturbing data stored in other memory cell blocks. A command execution logic module 40 receives the above-described interface signals from memory controller 22. Command execution logic module 40 controls internal state machine 30, which provides write and block erase timing sequences to memory cell array 38 through an X-interface circuit 42 and a Y-interface circuit 44.

Y-interface circuit 44 provides access to individual memory cells along a column of memory cell array 38 via data lines 46, input buffer 48, input data latch 50, and output data buffer 52. Input data latch 50 and output buffer 52 are coupled to bitlines (shown in FIG. 2) from the memory cell array 38. Y-interface circuit 44 includes a Y-decoder circuit, Y-select gates, sense-amplifiers, and write/erase bit compare and verify circuits. X-interface circuit 42 provides access to rows of memory cells through wordlines (shown in FIG. 2) in memory cell array 38, which are electrically coupled to control gates (also called select gates) of floating gate transistors in memory cell array 38. X-interface circuit 42 includes decoding and control circuits for erasing individual blocks of memory cells in memory cell array 38.

In one embodiment, a Vpp switch/pump 54 includes charge pump circuits that draw power from the write/erase power supply voltage Vpp at node 34. Vpp switch/pump 54 provides voltage to X-interface circuit 42 and Y-interface circuit 44 for programming(writing) and erasing operations.

Figure 2:
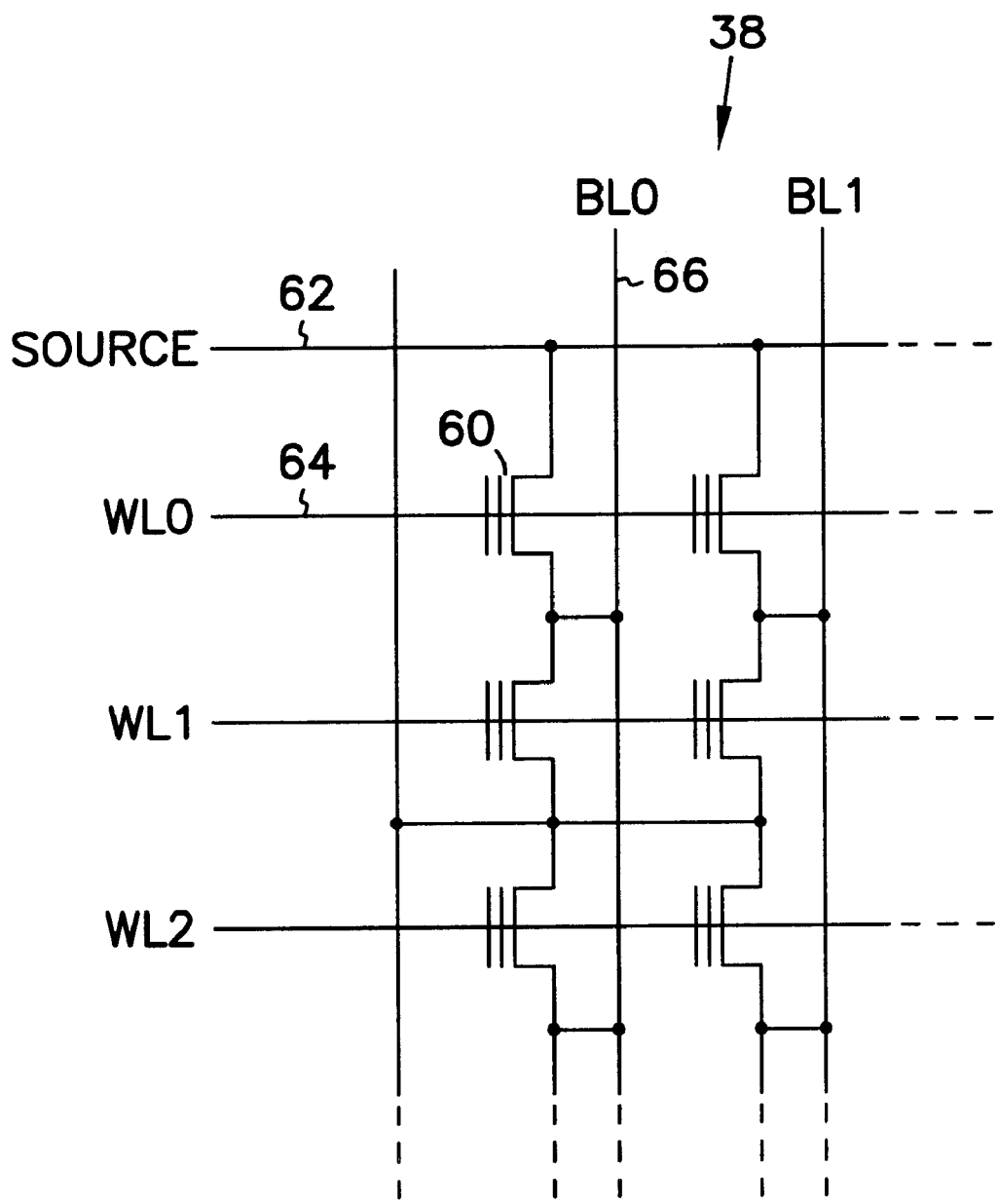
FIG. 2 is a schematic diagram of a portion of a flash memory cell array.

A portion of a flash memory cell array, such as memory cell array 38, is illustrated in schematic diagram form in FIG. 2. Memory cell array 38 includes floating gate transistors, such as indicated at 60. All of the sources of each floating gate transistor memory cell 60 within a given erase block are coupled to a common source line 62. Wordlines, such as indicated at 64, are each electrically coupled to control gates of a corresponding row of floating gate transistor memory cells 60. Bitlines, such as indicated at 66, are electrically coupled to drains of a corresponding column of floating gate transistor memory cells 60.

In operation, during a read of a byte or a word of data, the addressed wordline 64 (row) is brought to a logic high level which is greater than the voltage threshold of an erased floating gate transistor memory cell 60. This condition on the control gate of a memory cell 60 turns on an erased memory cell 60 to permit current to flow from its drain to its source. This condition on the control gate causes programmed/written memory cells 60 to remain in an "off" state, with little current flow from drain to source. The memory cell current is detected by sense amps and amplified to appropriate logic levels provided to output buffer 52. All non-addressed wordlines 64 within a memory array cell 38 remain at a logic low level.

Writes are also performed on a random access basis. During a write operation, an address wordline 64 is brought to a programming voltage such as 12 volts. An addressed bitline is brought to approximately 6 volts and the source remains at 0 volts. All non-addressed wordlines within memory cell array 38 remain at a low logic level.

Write operations in memory cell array 38 are performed on a block basis. The source of a floating gate transistor memory cell is common to each cell within a given erase block. During a block erase operation, bitlines 66 are left open, while all wordlines 64 are brought to 0 volts. The source line 62 is brought to 12 volts to erase all cells within the block. During the erase operation, other blocks in the device are not exposed to high voltages to reduce the chance of data corruption of other blocks during the erase.

Conventional Data Latch

Figure 3:
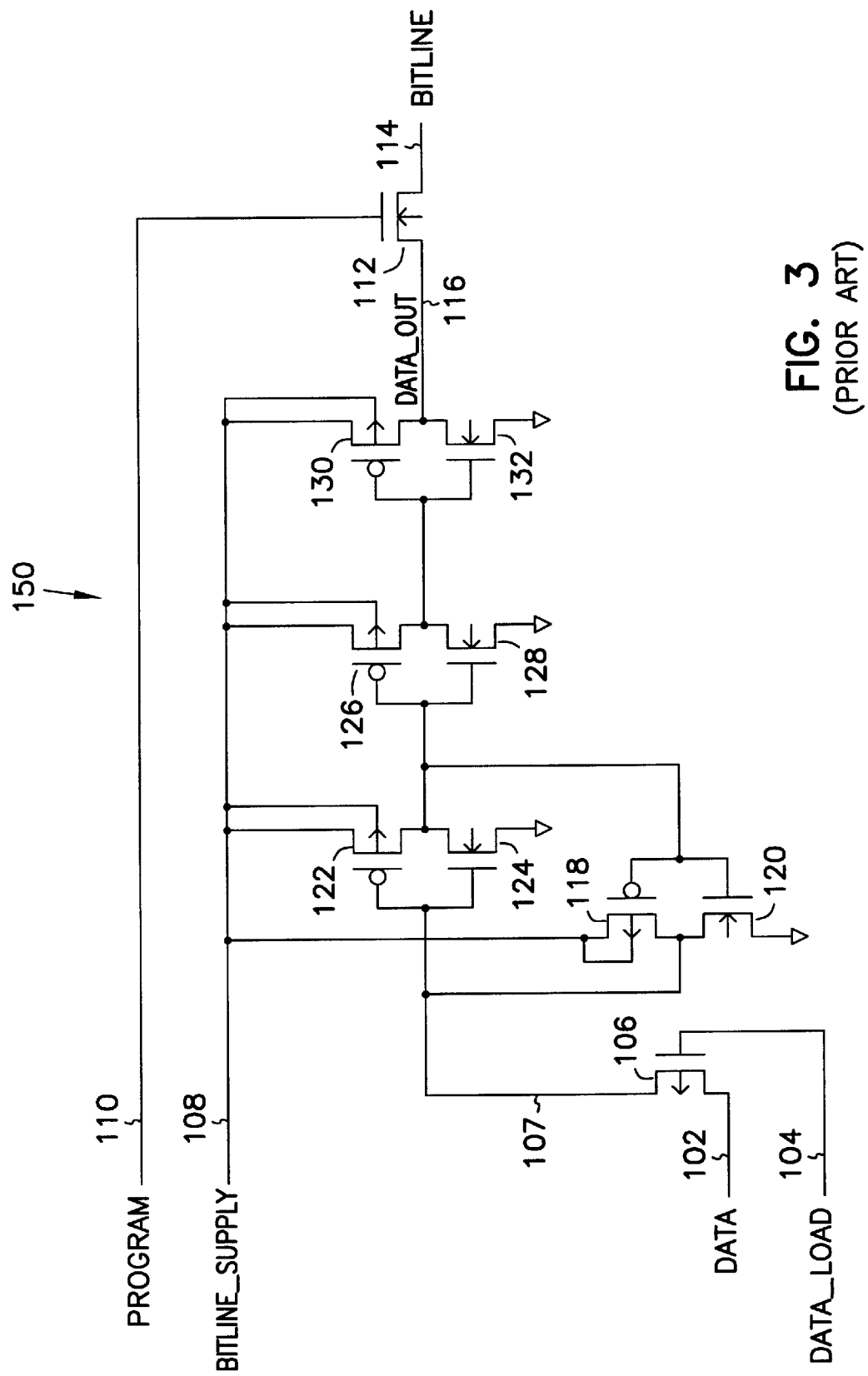
FIG. 3 is a schematic diagram of an input data latch for a flash memory system.

A conventional data latch which is commonly used in flash memories is illustrated generally at 150 in FIG. 3. Data is supplied to data latch 150 on a line 102. A data_load signal on a line 104 controls a gate of an n-channel transistor 106 for coupling the data on line 102 into data latch 150 via an in signal on a line 107. If a floating gate memory cell is to be programmed, the data signal on line 102 is a logic zero. If the cell is not to be programmed, a logic one is provided on the data signal on line 102. A bitline supply provided on a line 108 is typically set to a bitline programming voltage, such as approximately 5 volts. During a program operation, a program signal on a line 110 is brought to a high level. The program signal on line 110 is typically driven by a high voltage supply, such as approximately 10 volts. The program signal on line 110 is coupled to a gate of an n-channel transistor 112 to control n-channel transistor 112.

A bitline 1 14 is coupled to drains of floating gate transistor memory cells, such as memory cells 60 illustrated in FIG. 2. N-channel transistor 112 switches a data_out signal on a line 116 from data latch 150 to bitline 114 based on the program signal on line 110. Data latch 150 includes four transistor pairs, each pair configured as an inverter, coupled in a known manner to latch the in signal on line 107 and provide the data_out signal on line 116. A first inverter transistor pair includes a p-channel transistor 118 coupled to bitline supply 108 and an n-channel transistor 120 coupled to ground. The second inverter transistor pair includes a p-channel transistor 122 coupled to bitline supply 108 and an n-channel transistor 124 coupled to ground. The third inverter transistor pair includes a p-channel transistor 126 coupled to the bitline supply 108 and an n-channel transistor 128 coupled to ground. A fourth inverter transistor pair includes a p-channel transistor 130 coupled to bitline supply 108 and an n-channel transistor 132 coupled to ground.

When data latch 150 is loaded with a logic zero from data line 102, the data_out signal on line 116 is brought to a high potential of the bitline supply 108 via p-channel transistor 130. When data latch 150 is loaded with a logic one from data line 102, then the data_out signal on line 116 is brought to a ground potential as driven by n-channel transistor 132.

Bitline 114 needs to be at a high voltage, such as approximately five volts, level during a program operation. Therefore, during a program operation, data latch 150 is loaded with a zero logic level from data line 102 and the data_out signal on line 116 is driven to the bitline supply potential 108. When the program signal on line 110 is active, the high voltage (voltage of bitline supply 108) on the data_out signal on line 116 is switched through n-channel transistor 112 to bitline 114 to be applied to the drains of the floating gate transistor memory cells 60. In this way, the floating gate memory cell being programmed draws some current supplied by the bitline supply 108.

In the case where multiple bits of data are programmed simultaneously, the programming current for all of the floating gate transistor memory cells 60 is provided by bitline supply 108. If one floating gate memory cell or bitline is defective, that floating gate memory cell potentially draws a large amount of current. This large amount of current potentially drags down the bitline supply 108 which effects the programming operation of other floating gate transistor memory cells being programmed.

Data Latch with a Current Limiter

Figure 4:
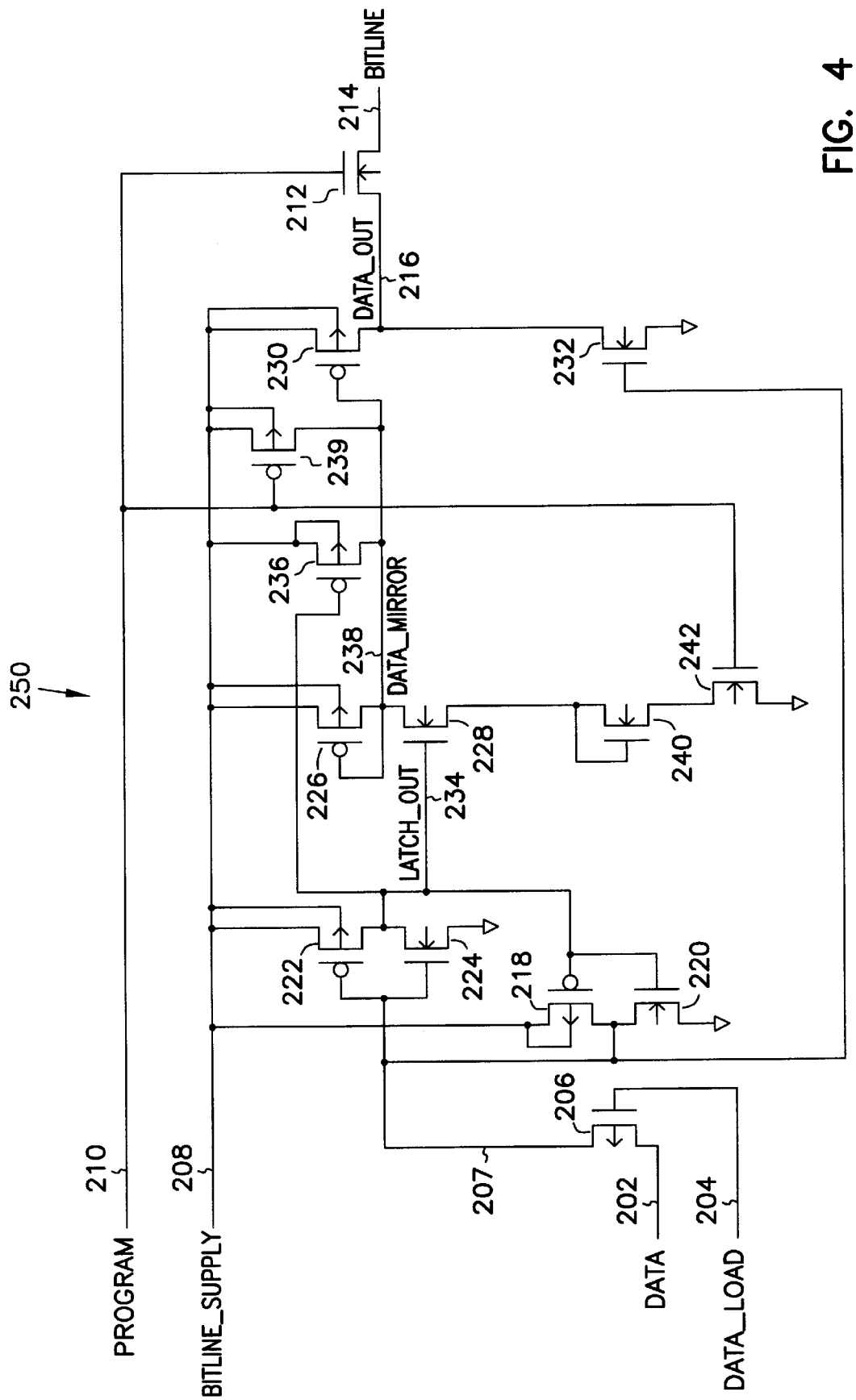
FIG. 4 is a schematic diagram of an input data latch for a flash memory system which includes a current limiter according to the present invention.

A data latch with a current limiter according to the present invention is illustrated generally at 250 in FIG. 4. Data is supplied to data latch 250 on a line 202. A data_load signal on a line 204 controls a gate of an n-channel transistor 206 for coupling the data on line 202 into data latch 250 via an in signal on a line 207. If a floating gate memory cell is to be programmed, the data signal on line 202 is a logic zero. If the cell is not to be programmed, a logic one is provided on the data signal on line 202. A bitline supply provided on a line 208 is typically set to a bitline programming voltage, such as approximately 5 volts. During a program operation, a program signal on a line 210 is brought to a high level. The program signal on line 210 is typically driven by a high voltage supply, such as approximately 10 volts. The program signal on line 210 is coupled to a gate of an n-channel transistor 212 to control n-channel transistor 212.

A bitline 214 is coupled to drains of floating gate transistor memory cells, such as memory cells 60 illustrated in FIG. 2. N-channel transistor 212 switches a data_out signal on a line 216 from data latch 250 to bitline 214 based on the program signal on line 210. Data latch 250 includes two transistor pairs, each pair configured as an inverter, and coupled together to latch the in signal on line 207 and provide a latch_out signal on a line 234. A first inverter transistor pair includes a p-channel transistor 218 coupled to bitline supply 208 and an n-channel transistor 220 coupled to ground. The second inverter transistor pair includes a p-channel transistor 222 coupled to bitline supply 208 and an n-channel transistor 224 coupled to ground.

When data latch 250 is loaded with a logic zero from data line 202, the data_out signal on line 216 is brought to a high potential of the bitline supply 208 via p-channel transistor 230. When data latch 250 is loaded with a logic one from data line 202, then the data_out signal on line 216 is brought to a ground potential as driven by n-channel transistor 232.

Bitline 214 needs to be at a high voltage, such as approximately five volts, level during a program operation. Therefore, during a program operation, data latch 250 is loaded with a zero logic level from data line 202 and the data_out signal on line 216 is driven to the bitline supply potential 208. When the program signal on line 210 is active, the high voltage (voltage of bitline supply 208) on the data_out signal on line 216 is switched through n-channel transistor 212 to bitline 214 to be applied to the drains of the floating gate transistor memory cells 60. In this way, the floating gate memory cell being programmed draws some current supplied by the bitline supply 208.

In the case where a logic one is loaded on data line 202 into data latch 250, the signal on line 207 is also a logic one. In this case, the data_out signal on line 216 is brought to a ground potential via n-channel transistor 232. The latch_out signal on line 234 is provided from inverter/transistor pair 222 and 224. The latch_out signal on line 234 is coupled to and controls the gates of an n-channel transistor 228 and a p-channel transistor 236 which is coupled between the bitline supply 208 and a data_mirror signal on a line 238. In addition, a p-channel transistor 239 has its gate controlled by the program signal on line 210 and is coupled between the bitline supply 208 and the data_mirror signal on line 238.

When the in signal on line 207 is a logic one, transistor/inverter pair 222 and 224 operate to invert the in signal on line 207 to provide a logic zero on the latch_out signal on line 234. A logic zero on the latch_out signal on line 234 turns off n-channel transistor 228 and turns on p-channel transistor 236. With p-channel transistor 236 on, the data_mirror signal on line 238 is driven to the bitline supply potential 208. The data_mirror signal on line 238 is coupled to the gate of p-channel transistor 230. Thus, when the data_mirror signal on line 238 is driven to the bitline supply 208, p-channel transistor 230 is shut off When the program signal on line 210 is brought high, the bitline 214 is driven to ground potential via n-channel transistor 232.

Data latch 250 includes an n-channel transistor 240 and an n-channel transistor 242 which are serially coupled between n-channel transistor 228 and ground. In addition, a p-channel transistor 226 is coupled between n-channel transistor 228 and the bitline supply 208. The program signal on line 210 is coupled to the gate of n-channel transistor 242, such that when the program signal goes high, n-channel transistor 242 is turned on. Nevertheless, since n-channel transistor 228 is off, no current is drawn from bitline supply 208 to ground.

In the case where a logic zero is loaded from data line 202 into data latch 250, n-channel transistor 232 and p-channel transistor 236 are turned off, and n-channel transistor 228 is turned on. When the program signal on line 210 is brought high, n-channel transistor 242 is turned on. In this case, there is a current path between bitline supply 208 and ground via transistors 226, 228, 240, and 242. The amount of current drawn between bitline supply 208 and ground depends on the size of n-channel transistor 240.

P-channel transistor 226, n-channel transistor 240, and p-channel transistor 230 are configured to form a current mirror. The amount of current mirrored onto p-channel transistor 230 depends on the ratio of p-channel transistor 226 and p-channel transistor 230. The current mirror formed from transistors 226, 240, and 230 limits the current that bitline supply 208 provides to a floating gate transistor memory cell 60 being programmed. The combination of p-channel transistor 226 and n-channel transistor 240 sets the voltage on the data_mirror signal on line 238. The voltage set on the data_mirror signal on line 238 controls the gate of p-channel transistor 230. Finally, p-channel transistor 230 provides the current to bitline 214 during programming operations.

Data latch 250, having a current limiter as described above, limits the current drawn by defective floating gate transistor memory cells 60 through bitline 214. By limiting the amount of current drawn through bitline 214, other floating gate transistor memory cells can be programmed at the same time as the defective floating gate transistor memory cell. In this way, the current limiter in data latch 250 limits the current a defective column consumes. Consequently, the defective column does not draw too much current and does not substantially affect the programming of other floating gate transistor memory cells. It will be recognized that the current limiter is set above a current required to program normal non-defective memory cells. Thus, normal program operations of non-defective memory cells are not adversely affected.

In past flash memory systems, approximately 8 to 16 data latches operate simultaneously in programming operations. However, a flash memory system, such a flash memory system 20, which includes input data latches 250 according to the present invention, can program significantly more floating gate transistor memory cells at one time. For example, a flash memory system having input data latches 250 according to the present invention can program at least 256 floating gate transistor memory cells at one time. The operation of at least up to 256 input data latches 250 simultaneously is made possible because of the current limiter on each data latch 250. The current limiter permits a portion of the 256 floating gate transistor memory cells to be on a defective column without drawing too much current to adversely affect the programming of other floating gate transistor memory cells in other non-defective columns.

By way of example, in one embodiment if eight floating gate transistor memory cells are programmed at one time and one of the eight is shorted, the non-shorted cells draw approximately 7×0.5 milliamps=approximately 3.5 milliamps, while the current limiter in the defective column's data latch 250 limits the current drawn from bitline supply 208 to ground to somewhere between approximately 1 to 2 milliamps depending on where the current limiter of data latch 250 is set. In this example, the total current drawn for programming the eight floating gate transistor memory cells is approximately 3.5 milliamps +1 to 2 milliamps =approximately 4.5 to 5.5 milliamps.

One skilled in the art of flash memory design will recognize that the current limiter in the data latches 250 can be set by well known design techniques to set the maximum current that one defective floating gate memory cell can draw from bitline supply 208. Factors that determine the proper maximum current limit depend on manufacturing techniques, yield and other factors. The maximum current limit determines how many defective columns are tolerated during programming operations. For example, in one embodiment, by properly setting the maximum current that one defective floating gate memory cell can draw from bitline supply 208, approximately 10% of the columns for the memory cells being programmed simultaneously, can be defective without adversely affecting the non-defective cells.

In one embodiment of the data latch with a current limiter according to the present invention, the maximum current that one defective floating gate memory cell can draw from bitline supply is adjustable by trimming the maximum current limits. In one embodiment, the current limiter feature of the data latch according to the present invention can be disabled. For example, in one embodiment, the current limiter is disable by trimming the current limit so high that the current limiter is no longer limiting the current that one defective floating gate memory cell can draw from bitline supply.

CONCLUSION

A flash memory system according to the present invention includes an input data latch with a current limiter, such as data latch 250 of FIG. 4. The current limiter limits the current drawn by defective floating gate tranistor memory cells through the bitline coupled to the data latch. By limiting the amount of current drawn through the bitline, other floating gate transistor memory cells can be programmed simultaneously with one or more defective floating gate transistor memory cells. A defective column does not draw too much current and does not substantially affect the programming of other floating gate transistor memory cells.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. An enhanced bitline current generator for a memory system, comprising:
   an input stage having a first, a second, and a third connection;
   a data latch having input connections and an output connection, wherein the data latch inhibits undesired current draw, wherein the input connections are coupled to the input stage, and wherein the data latch includes a current mirror, wherein the current mirror includes:
      a first p-channel transistor that includes a gate, a source, a drain, and a bias, wherein the gate is coupled to the source, and wherein the drain and the bias are coupled to a supply signal;
      a second p-channel transistor that includes a gate, a source, a drain, and a bias, wherein the gate is coupled to the source of the first p-channel transistor, and wherein the drain and the source are coupled to the supply signal; and
      a first n-channel transistor that includes a gate, a source, a drain, and a bias, wherein the gate and the drain are coupled together such that the current mirror limits performs a current limiting function; and
   an output stage having a first, a second, and a third connection, wherein the output stage is coupled to the data latch.

2. An enhanced bitline current generator for a memory system, comprising:
   an input stage having a first, a second, and a third connection, wherein the first connection is coupled to a load signal, wherein the load signal is adapted to control the input stage;
   a data latch having input connections and an output connection, wherein the data latch inhibits undesired current draw, wherein the input connections are coupled to the input stage, and wherein the data latch includes a current mirror, wherein the current mirror includes:
      a first p-channel transistor that includes a gate, a source, a drain, and a bias, wherein the gate is coupled to the source, and wherein the drain and the bias are coupled to a supply signal;
      a second p-channel transistor that includes a gate, a source, a drain, and a bias, wherein the gate is coupled to the source of the first p-channel transistor, and wherein the drain and the source are coupled to the supply signal; and
      a first n-channel transistor that includes a gate, a source, a drain, and a bias, wherein the gate and the drain are coupled together such that the current mirror limits performs a current limiting function; and
   an output stage having a first, a second, and a third connection, wherein the output stage is coupled to the data latch.

3. An enhanced bitline current generator for a memory system, comprising:
   an input stage having a first, a second, and a third connection, wherein the second connection is coupled to a data signal, wherein the data signal has a logic level that is indicative of whether a cell of the memory system is to be programmed;
   a data latch having input connections and an output connection, wherein the data latch inhibits undesired current draw, wherein the input connections are coupled to the input stage, and wherein the data latch includes a current mirror, wherein the current mirror includes:
      a first p-channel transistor that includes a gate, a source, a drain, and a bias, wherein the gate is coupled to the source, and wherein the drain and the bias are coupled to a supply signal;
      a second p-channel transistor that includes a gate, a source, a drain, and a bias, wherein the gate is coupled to the source of the first p-channel transistor, and wherein the drain and the source are coupled to the supply signal; and
      a first n-channel transistor that includes a gate, a source, a drain, and a bias, wherein the gate and the drain are coupled together such that the current mirror limits performs a current limiting function; and
   an output stage having a first, a second, and a third connection, wherein the output stage is coupled to the data latch.

4. An enhanced bitline current generator for a memory system, comprising:
   an input stage having a first, a second, and a third connection, wherein the first connection is coupled to a load signal that is adapted to control the input stage, wherein the second connection is coupled to a data signal that is indicative of whether a cell of the memory system is to be programmed;
   a data latch having input connections and an output connection, wherein the data latch inhibits undesired current draw, wherein the input connections are coupled to the input stage, and wherein the data latch includes a current mirror, wherein the current mirror includes:
      a first p-channel transistor that includes a gate, a source, a drain, and a bias, wherein the gate is coupled to the source, and wherein the drain and the bias are coupled to a supply signal;
      a second p-channel transistor that includes a gate, a source, a drain, and a bias, wherein the gate is coupled to the source of the first p-channel transistor, and wherein the drain and the source are coupled to the supply signal; and a first n-channel transistor that includes a gate, a source, a drain, and a bias, wherein the gate and the drain are coupled together such that the current mirror limits performs a current limiting function; and an output stage having a first, a second, and a third connection, wherein the output stage is coupled to the data latch.

5. An enhanced bitline current generator for a memory system, comprising:

an input stage having a first, a second, and a third connection, wherein a data signal that is presented at the second connection is presented at the third connection when a load signal that is presented at the first connection is at a first predetermined level;

a data latch having input connections and an output connection, wherein the data latch inhibits undesired current draw, wherein the input connections are coupled to the input stage, and wherein the data latch includes a current mirror, wherein the current mirror includes:

a first p-channel transistor that includes a gate, a source, a drain, and a bias, wherein the gate is coupled to the source, and wherein the drain and the bias are coupled to a supply signal;

a second p-channel transistor that includes a gate, a source, a drain, and a bias, wherein the gate is coupled to the source of the first p-channel transistor, and wherein the drain and the source are coupled to the supply signal; and a first n-channel transistor that includes a gate, a source, a drain, and a bias, wherein the gate and the drain are coupled together such that the current mirror limits performs a current limiting function; and an output stage having a first, a second, and a third connection, wherein the output stage is coupled to the data latch.

6. An enhanced bitline current generator for a memory system, comprising:

an input stage having a first, a second, and a third connection, wherein a data signal that is presented at the second connection is presented at the third connection when a load signal that is presented at the first connection is at a first predetermined level;

a data latch having input connections and an output connection, wherein the data latch inhibits undesired current draw, wherein at least one input connection is coupled to the third connection of the input stage, and wherein the data latch includes a current mirror, wherein the current mirror includes:

a first p-channel transistor that includes a gate, a source, a drain, and a bias, wherein the gate is coupled to the source, and wherein the drain and the bias are coupled to a supply signal;

a second p-channel transistor that includes a gate, a source, a drain, and a bias, wherein the gate is coupled to the source of the first p-channel transistor, and wherein the drain and the source are coupled to the supply signal; and a first n-channel transistor that includes a gate, a source, a drain, and a bias, wherein the gate and the drain are coupled together such that the current mirror limits performs a current limiting function; and an output stage having a first, a second, and a third connection.

7. An enhanced bitline current generator for a memory system, comprising:

an input transistor having a gate, a source, and a drain to transfer a data signal that is presented at the source to the drain when a load signal that is presented at the gate is at a first predetermined level;

a data latch having input connections and an output connection, wherein the data latch inhibits undesired current draw, wherein at least one of the input connections is coupled to the drain of the input transistor, and wherein the data latch includes a current mirror, wherein the current mirror includes:

a first p-channel transistor that includes a gate, a source, a drain, and a bias, wherein the gate is coupled to the source, and wherein the drain and the bias are coupled to a supply signal;

a second p-channel transistor that includes a gate, a source, a drain, and a bias, wherein the gate is coupled to the source of the first p-channel transistor, and wherein the drain and the source are coupled to the supply signal; and a first n-channel transistor that includes a gate, a source, a drain, and a bias, wherein the gate and the drain are coupled together such that the current mirror limits performs a current limiting function; and an output stage having a first, a second, and a third connection, wherein the output stage is coupled to the data latch.

8. An enhanced bitline current generator for a memory system, comprising:

an n-channel input transistor having a gate, a source, and a drain to transfer a data signal that is presented at the source to the drain when a load signal that is presented at the gate is at a first predetermined level;

a data latch having input connections and an output connection, wherein the data latch inhibits undesired current draw, wherein the input connections are coupled to the n-channel input transistor, and wherein the data latch includes a current mirror, wherein the current mirror includes:

a first p-channel transistor that includes a gate, a source, a drain, and a bias, wherein the gate is coupled to the source, and wherein the drain and the bias are coupled to a supply signal;

a second p-channel transistor that includes a gate, a source, a drain, and a bias, wherein the gate is coupled to the source of the first p-channel transistor, and wherein the drain and the source are coupled to the supply signal; and a first n-channel transistor that includes a gate, a source, a drain, and a bias, wherein the gate and the drain are coupled together such that the current mirror limits performs a current limiting function; and an output stage having a first, a second, and a third connection, wherein the output stage is coupled to the data latch.

9. An enhanced bitline current generator for a memory system, comprising:

an n-channel input transistor having a gate, a source, and a drain to transfer a data signal that is presented at the source to the drain when a load signal that is presented at the gate is at a first predetermined level, wherein the data signal is at a logic low when a cell of the memory system is to be programmed;

a data latch having input connections and an output connection, wherein the data latch inhibits undesired current draw, wherein the input connections are coupled to the n-channel input transistor, and wherein the data latch includes a current mirror, wherein the current mirror includes:
- a first p-channel transistor that includes a gate, a source, a drain, and a bias, wherein the gate is coupled to the source, and wherein the drain and the bias are coupled to a supply signal;
- a second p-channel transistor that includes a gate, a source, a drain, and a bias, wherein the gate is coupled to the source of the first p-channel transistor, and wherein the drain and the source are coupled to the supply signal; and
- a first n-channel transistor that includes a gate, a source, a drain, and a bias, wherein the gate and the drain are coupled together such that the current mirror limits performs a current limiting function; and an output stage having a first, a second, and a third connection, wherein the output stage is coupled to the data latch.

10. An enhanced bitline current generator for a memory system, comprising:
an n-channel input transistor having a gate, a source, and a drain to transfer a data signal that is presented at the source to the drain when a load signal that is presented at the gate is at a first predetermined level, wherein the data signal is at a logic low when a cell of the memory system is to be programmed;
a data latch having input connections and an output connection, wherein the data latch inhibits undesired current draw, wherein at least one of the input connections is coupled to the drain of the input transistor, and wherein the data latch includes a current mirror, wherein the current mirror includes:
- a first p-channel transistor that includes a gate, a source, a drain, and a bias, wherein the gate is coupled to the source, and wherein the drain and the bias are coupled to a supply signal;
- a second p-channel transistor that includes a gate, a source, a drain, and a bias, wherein the gate is coupled to the source of the first p-channel transistor, and wherein the drain and the source are coupled to the supply signal; and
- a first n-channel transistor that includes a gate, a source, a drain, and a bias, wherein the gate and the drain are coupled together such that the current mirror limits performs a current limiting function; and an output stage having a first, a second, and a third connection, wherein the output stage is coupled to the data latch.

11. An enhanced bitline current generator for a memory system, comprising:
an input stage having a first, a second, and a third connection;
a data latch having input connections and an output connection to inhibit undesired current draw, wherein the data latch includes at least two inverters, wherein the input connections are coupled to the input stage, and wherein the data latch includes a current mirror, wherein the current mirror includes:
- a first p-channel transistor that includes a gate, a source, a drain, and a bias, wherein the gate is coupled to the source, and wherein the drain and the bias are coupled to a supply signal;
- a second p-channel transistor that includes a gate, a source, a drain, and a bias, wherein the gate is coupled to the source of the first p-channel transistor, and wherein the drain and the source are coupled to the supply signal; and
- a first n-channel transistor that includes a gate, a source, a drain, and a bias, wherein the gate and the drain are coupled together such that the current mirror limits performs a current limiting function; and an output stage having a first, a second, and a third connection, wherein the output stage is coupled to the data latch.

12. An enhanced bitline current generator for a memory system, comprising:
an input stage having a first, a second, and a third connection, wherein the first connection is receptive to a load signal, wherein the second connection is receptive to a data signal;
a data latch having input connections and an output connection to inhibit undesired current draw, wherein the data latch includes at least two inverters coupled together, wherein the input connections are coupled to the input stage, and wherein the data latch includes a current mirror, wherein the current mirror includes:
- a first p-channel transistor that includes a gate, a source, a drain, and a bias, wherein the gate is coupled to the source, and wherein the drain and the bias are coupled to a supply signal;
- a second p-channel transistor that includes a gate, a source, a drain, and a bias, wherein the gate is coupled to the source of the first p-channel transistor, and wherein the drain and the source are coupled to the supply signal; and
- a first n-channel transistor that includes a gate, a source, a drain, and a bias, wherein the gate and the drain are coupled together such that the current mirror limits performs a current limiting function; and an output stage having a first, a second, and a third connection, wherein the output stage is coupled to the data latch.

13. An enhanced bitline current generator for a memory system, comprising:
an input stage having a first, a second, and a third connection, wherein the first connection is receptive to a load signal, wherein the second connection is receptive to a data signal, wherein the input stage presents the data signal at the third connection when the load signal is at a first predetermined level;
a data latch having input connections and an output connection to inhibit undesired current draw, wherein the data latch includes at least two inverters coupled together that is receptive to the data signal to produce a latch out signal, wherein the input connections are coupled to the input stage, and wherein the data latch includes a current mirror receptive to the latch out signal, wherein the current mirror includes:
- a first p-channel transistor that includes a gate, a source, a drain, and a bias, wherein the gate is coupled to the source, and wherein the drain and the bias are coupled to a supply signal;
- a second p-channel transistor that includes a gate, a source, a drain, and a bias, wherein the gate is coupled to the source of the first p-channel transistor, and wherein the drain and the source are coupled to the supply signal; and
- a first n-channel transistor that includes a gate, a source, a drain, and a bias, wherein the gate and the drain are coupled together such that the current mirror limits performs a current limiting function; and an output stage having a first, a second, and a third connection, wherein the output stage is coupled to the data latch.

14. An enhanced bitline current generator for a memory system, comprising:
an input stage having a first, a second, and a third connection;
a data latch having input connections and an output connection to inhibit undesired current draw, wherein the data latch includes at least two inverters coupled together, wherein the at least two inverters are coupled to a supply signal and a current mirror, wherein the input connections are coupled to the input stage, and wherein the current mirror includes:
a first p-channel transistor that includes a gate, a source, a drain, and a bias, wherein the gate is coupled to the source, and wherein the drain and the bias are coupled to a supply signal;
a second p-channel transistor that includes a gate, a source, a drain, and a bias, wherein the gate is coupled to the source of the first p-channel transistor, and wherein the drain and the source are coupled to the supply signal; and
a first n-channel transistor that includes a gate, a source, a drain, and a bias, wherein the gate and the drain are coupled together such that the current mirror limits performs a current limiting function; and
an output stage having a first, a second, and a third connection, wherein the output stage is coupled to the data latch.

15. An enhanced bitline current generator for a memory system, comprising:
an input stage having a first, a second, and a third connection;
a data latch having input connections and an output connection to inhibit undesired current draw, wherein the data latch includes at least two inverters coupled together, wherein each of the at least two inverters include a p-channel transistor and an n-channel transistor, wherein the input connections are coupled to the input stage, and wherein the data latch includes a current mirror, wherein the current mirror includes:
a first p-channel transistor that includes a gate, a source, a drain, and a bias, wherein the gate is coupled to the source, and wherein the drain and the bias are coupled to a supply signal;
a second p-channel transistor that includes a gate, a source, a drain, and a bias, wherein the gate is coupled to the source of the first p-channel transistor, and wherein the drain and the source are coupled to the supply signal; and
a first n-channel transistor that includes a gate, a source, a drain, and a bias, wherein the gate and the drain are coupled together such that the current mirror limits performs a current limiting function; and
an output stage having a first, a second, and a third connection, wherein the output stage is coupled to the data latch.

16. An enhanced bitline current generator for a memory system, comprising:
an input stage having a first, a second, and a third connection;
a data latch to inhibit undesired current draw, wherein the data latch includes at least two inverters, wherein each of the at least two inverters include a p-channel transistor and an n-channel transistor, wherein each p-channel transistor is coupled to a supply signal, wherein each n-channel transistor is coupled to ground, wherein the input connections are coupled to the input stage, and wherein the data latch includes a current mirror coupled to the at least two inverters, wherein the current mirror includes:
a first p-channel transistor that includes a gate, a source, a drain, and a bias, wherein the gate is coupled to the source, and wherein the drain and the bias are coupled to a supply signal;
a second p-channel transistor that includes a gate, a source, a drain, and a bias, wherein the gate is coupled to the source of the first p-channel transistor, and wherein the drain and the source are coupled to the supply signal; and
a first n-channel transistor that includes a gate, a source, a drain, and a bias, wherein the gate and the drain are coupled together such that the current mirror limits performs a current limiting function; and
an output stage having a first, a second, and a third connection, wherein the output stage is coupled to the data latch.

17. An enhanced bitline current generator for a memory system, comprising:
an input stage having a first, a second, and a third connection;
a data latch coupled to the input stage to inhibit undesired current draw, wherein the data latch includes:
a first inverter that includes:
a p-channel transistor having a gate, a source, a drain, and a bias, wherein the gate of the p-channel transistor is coupled to the third connection of the input stage, wherein the drain and the bias of the p-channel transistor are coupled to a supply signal;
an n-channel transistor having a gate, a source, a drain, and a bias, wherein the drain of the n-channel transistor is coupled to the source of the p-channel transistor, wherein the source of the n-channel transistor is coupled to ground, wherein the gate of the n-channel transistor is coupled to the third connection of the input stage;
a second inverter that includes:
a p-channel transistor having a gate, a source, a drain, and a bias;
an n-channel transistor having a gate, a source, a drain, and a bias;
a current mirror, wherein the current mirror includes:
a first p-channel transistor that includes a gate, a source, a drain, and a bias, wherein the gate is coupled to the source, and wherein the drain and the bias are coupled to a supply signal;
a second p-channel transistor that includes a gate, a source, a drain, and a bias, wherein the gate is coupled to the source of the first p-channel transistor, and wherein the drain and the source are coupled to the supply signal; and
a first n-channel transistor that includes a gate, a source, a drain, and a bias, wherein the gate and the drain are coupled together such that the current mirror limits performs a current limiting function; and
an output stage having a first, a second, and a third connection, wherein the output stage is coupled to the data latch.

18. An enhanced bitline current generator for a memory system, comprising:
an input stage having a first, a second, and a third connection;

a data latch coupled to the input stage to inhibit undesired current draw, wherein the data latch includes:
  a first inverter that includes:
    a p-channel transistor having a gate, a source, a drain, and a bias, wherein the gate of the p-channel transistor of the first inverter is coupled to the third connection of the input stage, wherein the drain and the bias of the p-channel transistor of the first inverter are coupled to a supply signal;
    an n-channel transistor having a gate, a source, a drain, and a bias, wherein the drain of the n-channel transistor of the first inverter is coupled to the source of the p-channel transistor of the first inverter, wherein the source of the n-channel transistor of the first inverter is coupled to ground, wherein the gate of the n-channel transistor of the first inverter is coupled to the third connection of the input stage;
  a second inverter that includes:
    a p-channel transistor having a gate, a source, a drain, and a bias, wherein the gate of the p-channel transistor of the second inverter is coupled to source of the p-channel transistor of the first inverter, wherein the source of the p-channel of the second inverter is coupled to the third connection of the input stage, wherein the drain and bias of the p-channel transistor of the second inverter are coupled to the supply signal;
    an n-channel transistor having a gate, a source, a drain, and a bias, wherein the gate of the n-channel transistor of the second inverter is coupled to the source of the p-channel transistor of the first inverter, wherein the source of the n-channel of the second inverter is coupled to ground, wherein the drain of the n-channel transistor of the second inverter is coupled to the third connection of the input stage;
  a current mirror, wherein the current mirror includes:
    a first p-channel transistor that includes a gate, a source, a drain, and a bias, wherein the gate is coupled to the source, and wherein the drain and the bias are coupled to a supply signal;
    a second p-channel transistor that includes a gate, a source, a drain, and a bias, wherein the gate is coupled to the source of the first p-channel transistor, and wherein the drain and the source are coupled to the supply signal; and
    a first n-channel transistor that includes a gate, a source, a drain, and a bias, wherein the gate and the drain are coupled together such that the current mirror limits performs a current limiting function; and
an output stage having a first, a second, and a third connection, wherein the output stage is coupled to the data latch.

19. An enhanced bitline current generator for a memory system, comprising:
  an input stage having a first, a second, and a third connection;
  a data latch coupled to the input stage to inhibit undesired current draw, wherein the data latch includes:
    a first inverter that includes a p-channel transistor having a gate, source, drain, and bias and an n-channel transistor having a gate, a source, a drain, and a bias;
    a second inverter that includes a p-channel transistor having a gate, a source, a drain, and a bias and an n-channel transistor having a gate, a source, a drain, and a bias;
    a first n-channel transistor having a gate, a source, a drain, and a bias, wherein the gate of the first n-channel transistor is coupled to the source of the p-channel transistor of the first inverter;
  a current mirror, wherein the current mirror includes:
    a first p-channel transistor that includes a gate, a source, a drain, and a bias, wherein the gate is coupled to the source, and wherein the drain and the bias are coupled to a supply signal;
    a second p-channel transistor that includes a gate, a source, a drain, and a bias, wherein the gate is coupled to the source of the first p-channel transistor, and wherein the drain and the source are coupled to the supply signal; and
    an n-channel transistor that includes a gate, a source, a drain, and a bias, wherein the gate and the drain are coupled together such that the current mirror limits performs a current limiting function;
  an output stage having a first, a second, and a third connection, wherein the output stage is coupled to the data latch.

20. An enhanced bitline current generator for a memory system, comprising:
  an input stage having a first, a second, and a third connection;
  a data latch coupled to the input stage that includes:
    a set of inverters that includes a first inverter that includes input connections and an output connection; and a second inverter that includes input connections and an output connection;
    a current mirror that is coupled to the output connection of the first inverter, wherein the current mirror includes:
      a first p-channel transistor that includes a gate, a source, a drain, and a bias, wherein the gate is coupled to the source, and wherein the drain and the bias are coupled to a supply signal;
      a second p-channel transistor that includes a gate, a source, a drain, and a bias, wherein the gate is coupled to the source of the first p-channel transistor, and wherein the drain and the source are coupled to the supply signal; and
      a first n-channel transistor that includes a gate, a source, a drain, and a bias, wherein the gate and the drain are coupled together such that the current mirror limits performs a current limiting function; and
  an output stage having a first, a second, and a third connection, wherein the output stage is coupled to the data latch.

21. An enhanced bitline current generator for a memory system, comprising:
  an input stage having a first, a second, and a third connection;
  a data latch coupled to the input stage, wherein the data latch includes:
    a set of inverters that includes a first inverter that includes input connections and an output connection; and a second inverter that includes input connections and an output connection;
    a current mirror that is coupled to the output connection of the first inverter, wherein the current mirror includes:
      a first p-channel transistor that includes a gate, a source, a drain, and a bias, wherein the gate is coupled to the source, and wherein the drain and the bias are coupled to a supply signal;

a second p-channel transistor that includes a gate, a source, a drain, and a bias, wherein the gate is coupled to the source of the first p-channel transistor, and wherein the drain and the source are coupled to the supply signal; and a first n-channel transistor that includes a gate, a source, a drain, and a bias, wherein the gate and the drain are coupled together such that the current mirror limits performs a current limiting function; and an output stage having a first, a second, and a third connection, wherein the output stage is coupled to the data latch.

22. An enhanced bitline current generator for a memory system, comprising:

an input stage having a first, a second, and a third connection;

a data latch coupled to the input stage at the third connection, wherein the data latch includes:

a set of inverters that includes a first inverter that includes input connections and an output connection; and a second inverter that includes input connections and an output connection;

a current mirror that is coupled to the output connection of the first inverter, wherein the current mirror includes:

a first p-channel transistor that includes a gate, a source, a drain, and a bias, wherein the gate is coupled to the source, and wherein the drain and the bias are coupled to a supply signal;

a second p-channel transistor that includes a gate, a source, a drain, and a bias, wherein the gate is coupled to the source of the first p-channel transistor, and wherein the drain and the source are coupled to the supply signal; and a first n-channel transistor that includes a gate, a source, a drain, and a bias, wherein the gate and the drain are coupled together such that the current mirror limits performs a current limiting function; and an output stage having a first, a second, and a third connection, wherein the output stage is coupled to the data latch.

23. An enhanced bitline current generator for a memory system, comprising:

an input stage having a first, a second, and a third connection;

a data latch coupled to the third connection that includes:

a set of inverters that includes a first inverter that includes input connections and an output connection; and a second inverter that includes input connections and an output connection;

a current mirror that is coupled to the output connection of the first inverter, wherein the current mirror includes:

a first p-channel transistor that includes a gate, a source, a drain, and a bias, wherein the gate is coupled to the source, and wherein the drain and the bias are coupled to a supply signal;

a second p-channel transistor that includes a gate, a source, a drain, and a bias, wherein the gate is coupled to the source of the first p-channel transistor, and wherein the drain and the source are coupled to the supply signal; and a first n-channel transistor that includes a gate, a source, a drain, and a bias, wherein the gate and the drain are coupled together such that the current mirror limits performs a current limiting function; and an output stage having a first, a second, and a third connection, wherein the output stage is coupled to the data latch.

24. An enhanced bitline current generator for a memory system, comprising:

an input stage having a first, a second, and a third connection;

a data latch coupled to the third connection and adapted to receive a data input signal, wherein the data latch includes:

a set of inverters that includes a first inverter that includes input connections and an output connection; and a second inverter that includes input connections and an output connection;

a current mirror that is coupled to the output connection of the first inverter, wherein the current mirror includes:

a first p-channel transistor that includes a gate, a source, a drain, and a bias, wherein the gate is coupled to the source, and wherein the drain and the bias are coupled to a supply signal;

a second p-channel transistor that includes a gate, a source, a drain, and a bias, wherein the gate is coupled to the source of the first p-channel transistor, and wherein the drain and the source are coupled to the supply signal; and a first n-channel transistor that includes a gate, a source, a drain, and a bias, wherein the gate and the drain are coupled together such that the current mirror limits performs a current limiting function; and an output stage having a first, a second, and a third connection, wherein the output stage is coupled to the data latch.

25. An enhanced bitline current generator for a memory system, comprising:

an input stage having a first, a second, and a third connection;

a data latch coupled to the input stage, wherein the data latch includes:

a set of inverters that includes a first inverter that includes input connections and an output connection; and a second inverter that includes input connections and an output connection;

a current mirror that is coupled to the output connection of the first inverter, wherein the current mirror includes:

a first p-channel transistor that includes a gate, a source, a drain, and a bias, wherein the gate is coupled to the source, and wherein the drain and the bias are coupled to a supply signal;

a second p-channel transistor that includes a gate, a source, a drain, and a bias, wherein the gate is coupled to the source of the first p-channel transistor, and wherein the drain and the source are coupled to the supply signal;

a first n-channel transistor that includes a gate, a source, a drain, and a bias, wherein the gate and the drain are coupled together; and an output stage having a first, a second, and a third connection, wherein the output stage is coupled to the data latch.

26. An enhanced bitline current generator for a memory system, comprising:

an input stage having a first, a second, and a third connection;

a data latch coupled to the input stage, wherein the data latch includes:

a set of inverters that includes a first inverter that includes input connections and an output connection; and a second inverter that includes input connections and an output connection;

a current mirror that includes:

a first p-channel transistor that includes a gate, a source, a drain, and a bias, wherein the gate is coupled to the source, and wherein the drain and the bias are coupled to a supply signal;

a second p-channel transistor that includes a gate, a source, a drain, and a bias, wherein the gate is coupled to the source of the first p-channel transistor, and wherein the drain and the source are coupled to the supply signal;

a first n-channel transistor that includes a gate, a source, a drain, and a bias, wherein the gate and the drain are coupled together;

a second n-channel transistor that includes a gate, a source, a drain, and a bias, wherein the gate is coupled to the output connection of the first inverter, wherein the source is coupled to the drain of the first n-channel transistor of the current mirror, and wherein the drain is coupled to the source of the first p-channel transistor of the current mirror; and an output stage having a first, a second, and a third connection, wherein the output stage is coupled to the data latch.

27. An enhanced bitline current generator for a memory system, comprising:

an input stage having a first, a second, and a third connection;

a data latch coupled to the input stage, wherein the data latch includes:

a set of inverters that includes a first inverter that includes input connections and an output connection; and a second inverter that includes input connections and an output connection;

a current mirror that includes:

a first p-channel transistor that includes a gate, a source, a drain, and a bias, wherein the gate is coupled to the source, and wherein the drain and the bias are coupled to a supply signal;

a second p-channel transistor that includes a gate, a source, a drain, and a bias, wherein the gate is coupled to the source of the first p-channel transistor, and wherein the drain and the source are coupled to the supply signal;

a first n-channel transistor that includes a gate, a source, a drain, and a bias, wherein the gate and the drain are coupled together;

a second n-channel transistor that includes a gate, a source, a drain, and a bias, wherein the gate is coupled to the output connection of the first inverter, wherein the source is coupled to the drain of the first n-channel transistor of the current mirror, and wherein the drain is coupled to the source of the first p-channel transistor of the current mirror;

a third n-channel transistor that includes a gate, a source, a drain, and a bias, wherein the gate is coupled to a program signal, wherein the drain is coupled to the source of the second n-channel transistor, and wherein the source is coupled to ground; and an output stage having a first, a second, and a third connection, wherein the output stage is coupled to the data latch.

28. An enhanced bitline current generator for a memory system, comprising:

an input stage having a first, a second, and a third connection;

a data latch coupled to the input stage, wherein the data latch includes:

a set of inverters that includes a first inverter that includes input connections and an output connection; and a second inverter that includes input connections and an output connection;

a current mirror that includes:

a first p-channel transistor that includes a gate, a source, a drain, and a bias, wherein the gate is coupled to the source, and wherein the drain and the bias are coupled to a supply signal;

a second p-channel transistor that includes a gate, a source, a drain, and a bias, wherein the gate is coupled to the source of the first p-channel transistor, and wherein the drain and the source are coupled to the supply signal;

a first n-channel transistor that includes a gate, a source, a drain, and a bias, wherein the gate and the drain are coupled together;

a second n-channel transistor that includes a gate, a source, a drain, and a bias, wherein the gate is coupled to the output connection of the first inverter, wherein the source is coupled to the drain of the first n-channel transistor of the current mirror, and wherein the drain is coupled to the source of the first p-channel transistor of the current mirror;

a third n-channel transistor that includes a gate, a source, a drain, and a bias, wherein the gate is coupled to a program signal, wherein the drain is coupled to the source of the second n-channel transistor, and wherein the source is coupled to ground;

a third p-channel transistor that includes a gate, a source, a drain, and a bias, wherein the gate is coupled to the output of the first inverter, wherein the drain and the bias are coupled to the supply signal, and wherein the source is coupled to the source of the first p-channel transistor of the current mirror; and an output stage having a first, a second, and a third connection, wherein the output stage is coupled to the data latch.

29. An enhanced bitline current generator for a memory system, comprising:

an input stage having a first, a second, and a third connection;

a data latch coupled to the input stage, wherein the data latch includes:

a set of inverters that includes a first inverter that includes input connections and an output connection; and a second inverter that includes input connections and an output connection, wherein the output connection of the second inverter is coupled to the third connection of the input stage;

a current mirror that includes:

a first p-channel transistor that includes a gate, a source, a drain, and a bias, wherein the gate is coupled to the source, and wherein the drain and the bias are coupled to a supply signal;

a second p-channel transistor that includes a gate, a source, a drain, and a bias, wherein the gate is coupled to the source of the first p-channel transistor, and wherein the drain and the source are coupled to the supply signal;

a first n-channel transistor that includes a gate, a source, a drain, and a bias, wherein the gate and the drain are coupled together;

a second n-channel transistor that includes a gate, a source, a drain, and a bias, wherein the gate is coupled to the output connection of the first inverter, wherein the source is coupled to the drain of the first n-channel transistor of the current mirror, and wherein the drain is coupled to the source of the first p-channel transistor of the current mirror;

a third n-channel transistor that includes a gate, a source, a drain, and a bias, wherein the gate is coupled to a program signal, wherein the drain is coupled to the source of the second n-channel transistor, and wherein the source is coupled to ground;

a fourth n-channel transistor that includes a gate, a source, a drain, and a bias, wherein the gate is coupled to the output connection of the second inverter, wherein the drain is coupled to the source of the second p-channel transistor of the current mirror, wherein the source is coupled to ground; and an output stage having a first, a second, and a third connection, wherein the output stage is coupled to the data latch.

30. An enhanced bitline current generator for a memory system, comprising:

an input stage having a first, a second, and a third connection;

a data latch coupled to the input stage, wherein the data latch includes:

a set of inverters that includes a first inverter that includes input connections and an output connection; and a second inverter that includes input connections and an output connection, wherein the output connection of the second inverter is coupled to the third connection of the input stage;

a current mirror that includes:

a first p-channel transistor that includes a gate, a source, a drain, and a bias, wherein the gate is coupled to the source, and wherein the drain and the bias are coupled to a supply signal;

a second p-channel transistor that includes a gate, a source, a drain, and a bias, wherein the gate is coupled to the source of the first p-channel transistor, and wherein the drain and the source are coupled to the supply signal;

a first n-channel transistor that includes a gate, a source, a drain, and a bias, wherein the gate and the drain are coupled together;

a second n-channel transistor that includes a gate, a source, a drain, and a bias, wherein the gate is coupled to the output connection of the first inverter, wherein the source is coupled to the drain of the first n-channel transistor of the current mirror, and wherein the drain is coupled to the source of the first p-channel transistor of the current mirror;

a third n-channel transistor that includes a gate, a source, a drain, and a bias, wherein the gate is coupled to a program signal, wherein the drain is coupled to the source of the second n-channel transistor, and wherein the source is coupled to ground;

a fourth n-channel transistor that includes a gate, a source, a drain, and a bias, wherein the gate is coupled to the output connection of the second inverter, wherein the drain is coupled to the source of the second p-channel transistor of the current mirror, wherein the source is coupled to ground;

a third p-channel transistor that includes a gate, a source, a drain, and a bias, wherein the gate is coupled to the output of the first inverter, wherein the drain and the bias are coupled to the supply signal, and wherein the source is coupled to the source of the first p-channel transistor of the current mirror; and an output stage having a first, a second, and a third connection, wherein the output stage is coupled to the data latch.

31. An enhanced bitline current generator for a memory system, comprising:

an input stage having a first, a second, and a third connection;

a data latch coupled to the input stage, wherein the data latch includes:

a set of inverters that includes a first inverter that includes input connections and an output connection; and a second inverter that includes input connections and an output connection, wherein the output connection of the second inverter is coupled to the third connection of the input stage;

a current mirror that includes:

a first p-channel transistor that includes a gate, a source, a drain, and a bias, wherein the gate is coupled to the source, and wherein the drain and the bias are coupled to a supply signal;

a second p-channel transistor that includes a gate, a source, a drain, and a bias, wherein the gate is coupled to the source of the first p-channel transistor, and wherein the drain and the source are coupled to the supply signal;

a first n-channel transistor that includes a gate, a source, a drain, and a bias, wherein the gate and the drain are coupled together;

a second n-channel transistor that includes a gate, a source, a drain, and a bias, wherein the gate is coupled to the output connection of the first inverter, wherein the source is coupled to the drain of the first n-channel transistor of the current mirror, and wherein the drain is coupled to the source of the first p-channel transistor of the current mirror;

a third n-channel transistor that includes a gate, a source, a drain, and a bias, wherein the gate is coupled to a program signal, wherein the drain is coupled to the source of the second n-channel transistor, and wherein the source is coupled to ground;

a fourth n-channel transistor that includes a gate, a source, a drain, and a bias, wherein the gate is coupled to the output connection of the second inverter, wherein the drain is coupled to the source of the second p-channel transistor of the current mirror, wherein the source is coupled to ground;

a third p-channel transistor that includes a gate, a source, a drain, and a bias, wherein the gate is coupled to the output of the first inverter, wherein the drain and the bias are coupled to the supply signal, and wherein the source is coupled to the gate of the second p-channel transistor of the current mirror;

a fourth p-channel transistor that includes a gate, a source, a drain, and a bias, wherein the gate is coupled to the program signal, wherein the drain and the bias are coupled to the supply signal, and wherein the source is coupled to the gate of the second p-channel transistor of the current mirror; and an output stage having a first, a second, and a third connection, wherein the output stage is coupled to the data latch.

32. An enhanced bitline current generator for a memory system, comprising:

an input stage having a first, a second, and a third connection;

a data latch coupled to the input stage, wherein the data latch includes:
- a set of inverters that includes a first inverter that includes input connections and an output connection; and a second inverter that includes input connections and an output connection, wherein the output connection of the second inverter is coupled to the third connection of the input stage;
- a current mirror that includes an input connection and an output connection; and an output stage having a first, a second, and a third connection, wherein the first connection is coupled to a program signal, wherein the second connection is coupled to the output connection of the current mirror.

33. An enhanced bitline current generator for a memory system, comprising:

an input stage having a first, a second, and a third connection;

a data latch coupled to the input stage, wherein the data latch includes:
- a set of inverters that includes a first inverter that includes input connections and an output connection; and a second inverter that includes input connections and an output connection, wherein the output connection of the second inverter is coupled to the third connection of the input stage;
- a current mirror that includes an input connection and an output connection; and an output stage having a gate, a source, and a drain, and a bias, wherein the gate is coupled to a program signal, wherein the source is coupled to the output connection of the current mirror.

34. An enhanced bitline current generator for a memory system, comprising:

an input stage having a first, a second, and a third connection;

a data latch coupled to the input stage, wherein the data latch includes:
- a set of inverters that includes a first inverter that includes input connections and an output connection; and a second inverter that includes input connections and an output connection, wherein the output connection of the second inverter is coupled to the third connection of the input stage;
- a current mirror that includes:
  - a first p-channel transistor that includes a gate, a source, a drain, and a bias, wherein the gate is coupled to the source, and wherein the drain and the bias are coupled to a supply signal;
  - a second p-channel transistor that includes a gate, a source, a drain, and a bias, wherein the gate is coupled to the source of the first p-channel transistor, and wherein the drain and the source are coupled to the supply signal;
  - a first n-channel transistor that includes a gate, a source, a drain, and a bias, wherein the gate and the drain are coupled together;
  - a second n-channel transistor that includes a gate, a source, a drain, and a bias, wherein the gate is coupled to the output connection of the first inverter, wherein the source is coupled to the drain of the first n-channel transistor of the current mirror, and wherein the drain is coupled to the source of the first p-channel transistor of the current mirror;
  - a third n-channel transistor that includes a gate, a source, a drain, and a bias, wherein the gate is coupled to a program signal, wherein the drain is coupled to the source of the second n-channel transistor, and wherein the source is coupled to ground;
  - a fourth n-channel transistor that includes a gate, a source, a drain, and a bias, wherein the gate is coupled to the output connection of the second inverter, wherein the drain is coupled to the source of the second p-channel transistor of the current mirror, wherein the source is coupled to ground;
  - a third p-channel transistor that includes a gate, a source, a drain, and a bias, wherein the gate is coupled to the output of the first inverter, wherein the drain and the bias are coupled to the supply signal, and wherein the source is coupled to the gate of the second p-channel transistor of the current mirror;
  - a fourth p-channel transistor that includes a gate, a source, a drain, and a bias, wherein the gate is coupled to the program signal, wherein the drain and the bias are coupled to the supply signal, and wherein the source is coupled to the gate of the second p-channel transistor of the current mirror; and an output stage having a first, a second, and a third connection, wherein the first connection is coupled to a program signal, wherein the second connection is coupled to the output connection of the current mirror.

35. An enhanced bitline current generator for a memory system, comprising:

an input stage having a first, a second, and a third connection;

a data latch coupled to the input stage, wherein the data latch includes:
- a set of inverters that includes a first inverter that includes input connections and an output connection; and a second inverter that includes input connections and an output connection, wherein the output connection of the second inverter is coupled to the third connection of the input stage;
- a current mirror that includes:
  - a first p-channel transistor that includes a gate, a source, a drain, and a bias, wherein the gate is coupled to the source, and wherein the drain and the bias are coupled to a supply signal;
  - a second p-channel transistor that includes a gate, a source, a drain, and a bias, wherein the gate is coupled to the source of the first p-channel transistor, and wherein the drain and the source are coupled to the supply signal;
  - a first n-channel transistor that includes a gate, a source, a drain, and a bias, wherein the gate and the drain are coupled together;
  - a second n-channel transistor that includes a gate, a source, a drain, and a bias, wherein the gate is coupled to the output connection of the first inverter, wherein the source is coupled to the drain of the first n-channel transistor of the current mirror, and wherein the drain is coupled to the source of the first p-channel transistor of the current mirror;

a third n-channel transistor that includes a gate, a source, a drain, and a bias, wherein the gate is coupled to a program signal, wherein the drain is coupled to the source of the second n-channel transistor, and wherein the source is coupled to ground;

a fourth n-channel transistor that includes a gate, a source, a drain, and a bias, wherein the gate is coupled to the output connection of the second inverter, wherein the drain is coupled to the source of the second p-channel transistor of the current mirror, wherein the source is coupled to ground;

a third p-channel transistor that includes a gate, a source, a drain, and a bias, wherein the gate is coupled to the output of the first inverter, wherein the drain and the bias are coupled to the supply signal, and wherein the source is coupled to the gate of the second p-channel transistor of the current mirror;

a fourth p-channel transistor that includes a gate, a source, a drain, and a bias, wherein the gate is coupled to the program signal, wherein the drain and the bias are coupled to the supply signal, and wherein the source is coupled to the gate of the second p-channel transistor of the current mirror; and an output stage having a gate, a source, and a drain, and a bias, wherein the gate is coupled to a program signal, wherein the source is coupled to the output connection of the current mirror.

* * * * *

UNITED STATES PATENT AND TRADEMARK OFFICE
CERTIFICATE OF CORRECTION

PATENT NO. : 6,278,642 B1
DATED : August 21, 2001
INVENTOR(S) : Vinod Lakhani and Christophe J. Chevallier It is certified that error appears in the above-identified patent and that said Letters Patent is hereby corrected as shown below:

Column 1,
Line 55, delete extra "." after "reference".

Column 4,
Line 1, insert -- is -- between "memory" and "described".

Column 5,
Line 48, delete "1 14" and insert -- 114 --, therefor.

Column 7,
Line 30, insert -- . -- between "off" and "When".

Column 15, claim 14,
Line 26, delete "limits" and insert -- limit --, therefor.

Signed and Sealed this

Sixteenth Day of April, 2002

Attest:

JAMES E. ROGAN
*Attesting Officer*  *Director of the United States Patent and Trademark Office*